United States Patent
Kishimoto et al.

(10) Patent No.: US 10,879,870 B2
(45) Date of Patent: Dec. 29, 2020

(54) ELASTIC WAVE DEVICE, FRONT-END CIRCUIT, AND COMMUNICATION DEVICE

(71) Applicant: Murata Manufacturing Co., Ltd., Nagaokakyo (JP)

(72) Inventors: Yutaka Kishimoto, Nagaokakyo (JP); Tetsuya Kimura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 10 days.

(21) Appl. No.: 16/375,871

(22) Filed: Apr. 5, 2019

(65) Prior Publication Data

US 2019/0238114 A1  Aug. 1, 2019

Related U.S. Application Data

(63) Continuation of application No. PCT/JP2017/035180, filed on Sep. 28, 2017.

(30) Foreign Application Priority Data

Nov. 22, 2016 (JP) .................................. 2016-227322

(51) Int. Cl.
*H03H 9/02* (2006.01)
*H03H 9/25* (2006.01)
(Continued)

(52) U.S. Cl.
CPC .... *H03H 9/02653* (2013.01); *H03H 9/02007* (2013.01); *H03H 9/02574* (2013.01);
(Continued)

(58) Field of Classification Search
CPC ...... H03H 9/145; H03H 9/25; H03H 9/02677; H03H 9/02669; H03H 9/02653;
(Continued)

(56) References Cited

U.S. PATENT DOCUMENTS

2003/0169129 A1* 9/2003 Takamine .......... H03H 9/02771
333/195
2012/0194032 A1 8/2012 Kadota
(Continued)

FOREIGN PATENT DOCUMENTS

JP       04-65910 A    3/1992
JP   2006-121228 A    5/2006
(Continued)

OTHER PUBLICATIONS

Machine English translation of JPH0465910A Published on Mar. 2, 1992 (Year: 1992).*
(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An elastic wave device includes a piezoelectric substrate and an IDT electrode provided on the piezoelectric substrate. The IDT electrode includes a busbar electrode extending in an elastic wave propagation direction and electrode fingers connected to the busbar electrode and extending in a direction perpendicular or substantially perpendicular to the elastic wave propagation direction. The piezoelectric substrate includes a groove extending along the elastic wave propagation direction. The groove is provided on a side across the busbar electrode in the perpendicular or substantially perpendicular direction from a side at which the electrode fingers are located.

18 Claims, 10 Drawing Sheets

(51) Int. Cl.
*H03H 9/145* (2006.01)
*H03H 9/64* (2006.01)

(52) U.S. Cl.
CPC .... *H03H 9/02622* (2013.01); *H03H 9/02669* (2013.01); *H03H 9/02677* (2013.01); *H03H 9/145* (2013.01); *H03H 9/25* (2013.01); *H03H 9/64* (2013.01)

(58) Field of Classification Search
CPC .. H03H 9/02574; H03H 9/02622; H03H 9/64; H03H 9/02007; H03H 9/02818; H03H 9/02992; H03H 9/14538; H03H 9/72
USPC .......................................... 333/133, 193–196
See application file for complete search history.

(56) References Cited

U.S. PATENT DOCUMENTS

| | | |
|---|---|---|
| 2013/0285768 A1 | 10/2013 | Watanabe et al. |
| 2014/0152146 A1 | 6/2014 | Kimura et al. |

FOREIGN PATENT DOCUMENTS

| | | |
|---|---|---|
| WO | 2005/050836 A1 | 6/2005 |
| WO | 2011/046117 A1 | 4/2011 |
| WO | 2012/086441 A1 | 6/2012 |
| WO | 2012/086639 A1 | 6/2012 |

OTHER PUBLICATIONS

Official Communication issued in International Patent Application No. PCT/JP2017/035180, dated Nov. 28, 2017.

* cited by examiner

ELASTIC WAVE DEVICE, FRONT-END CIRCUIT, AND COMMUNICATION DEVICE

CROSS REFERENCE TO RELATED APPLICATIONS

This application claims the benefit of priority to Japanese Patent Application No. 2016-227322 filed on Nov. 22, 2016 and is a Continuation Application of PCT Application No. PCT/JP2017/035180 filed on Sep. 28, 2017. The entire contents of each of these applications are hereby incorporated herein by reference.

BACKGROUND OF THE INVENTION

1. Field of the Invention

The present invention relates to an elastic wave device including interdigital transducer (IDT) electrodes, a front-end circuit including the elastic wave device, and a communication device including the elastic wave device.

2. Description of the Related Art

Elastic wave devices have been widely used as resonators or band-pass filters.

International Publication No. 2005/050836 describes an end-surface reflection elastic wave device as an example of the elastic wave devices. In the elastic wave device, a pair of end surfaces opposite to each other reflect elastic waves. In the elastic wave device of International Publication No. 2005/050836, the pair of opposite end surfaces is formed by providing a groove at each outer side portion outside an IDT electrode in an elastic wave propagation direction. Elastic waves are reflected by the pair of end surfaces. Thus, elastic waves that propagate in the elastic wave propagation direction are trapped within the elastic wave device.

However, the elastic wave device described in International Publication No. 2005/050836 is able to reflect and trap elastic waves that propagate in the elastic wave propagation direction, but the elastic wave device is not able to trap elastic waves that propagate in a direction different from the elastic wave propagation direction, so there is a problem that some elastic waves leak to the outside of the elastic wave device.

SUMMARY OF THE INVENTION

Preferred embodiments of the present invention provide elastic wave devices and other devices that are each able to reduce leakage of elastic waves that propagate in a direction different from an elastic wave propagation direction, to an outside.

An elastic wave device according to a preferred embodiment of the present invention includes a piezoelectric substrate and an IDT electrode provided on the piezoelectric substrate. The IDT electrode includes a busbar electrode running in an elastic wave propagation direction and a plurality of electrode fingers connected to the busbar electrode and running in a direction perpendicular or substantially perpendicular to the elastic wave propagation direction. The piezoelectric substrate includes at least one groove disposed along the elastic wave propagation direction. The at least one groove is provided on a side across the busbar electrode in the perpendicular or substantially perpendicular direction from a side at which the plurality of electrode fingers is provided.

In this manner, since the elastic wave device includes the groove disposed along the elastic wave propagation direction, elastic waves that propagate in a direction different from the elastic wave propagation direction are reflected by the groove. Thus, leakage of elastic waves to the outside is reduced or prevented.

The at least one groove may include a plurality of grooves, and the plurality of grooves may be opposite to each other in the perpendicular or substantially perpendicular direction.

With this configuration, since the elastic wave device includes the plurality of grooves opposite to each other in the perpendicular or substantially perpendicular direction, elastic waves that propagate in a direction different from the elastic wave propagation direction are reflected by the grooves and trapped between the plurality of grooves. Thus, leakage of elastic waves to the outside is reduced or prevented.

The piezoelectric substrate may include a support substrate, a piezoelectric layer above the support substrate, and an intermediate layer between the support substrate and the piezoelectric layer. The IDT electrode may be provided on the piezoelectric layer. The at least one groove may extend from the piezoelectric layer to at least a portion of the intermediate layer.

With this configuration, elastic waves that propagate through the piezoelectric layer and the at least a portion of the intermediate layer are reflected by the groove. Thus, leakage of elastic waves that propagate in a direction different from the elastic wave propagation direction to the outside is reduced or prevented.

The piezoelectric substrate may include a support substrate, a piezoelectric layer above the support substrate, and an intermediate layer between the support substrate and the piezoelectric layer. The IDT electrode may be provided on the piezoelectric layer. The at least one groove may not be provided in the piezoelectric layer but the at least one groove may be provided in at least a portion of the intermediate layer.

With this configuration, elastic waves that propagate through at least a portion of the intermediate layer are reflected by the groove. Thus, leakage of elastic waves that propagate in a direction different from the elastic wave propagation direction to the outside is reduced or prevented.

The intermediate layer of the elastic wave device may include grain boundaries.

For example, even when a portion of elastic waves that propagate through the intermediate layer are scattered by the grain boundaries and the elastic waves propagate in a direction different from the elastic wave propagation direction, since the elastic wave device includes the groove disposed along the elastic wave propagation direction, the elastic waves are reflected. Thus, leakage of elastic waves that propagate in a direction different from the elastic wave propagation direction to the outside is reduced or prevented.

The intermediate layer may adjoin the piezoelectric layer.

With this configuration, leakage of the energy of elastic waves that propagate through the piezoelectric layer in a thickness direction is reduced or prevented.

When the intermediate layer includes grain boundaries, even when a portion of elastic waves that propagate through the intermediate layer that adjoins the piezoelectric layer are scattered and the elastic waves propagate in a direction different from the elastic wave propagation direction, since the elastic wave device includes the grooves opposite to each other in the perpendicular or substantially perpendicular direction to the elastic wave propagation direction, the elastic waves are reflected. Thus, leakage of elastic waves to the outside is reduced or prevented.

The intermediate layer may include one or a plurality of $SiO_2$ layers.

For example, even when a portion of elastic waves that propagate through the $SiO_2$ layer are scattered and the elastic waves propagate in a direction different from the elastic wave propagation direction, since the elastic wave device includes the groove disposed along the elastic wave propagation direction, the elastic waves are reflected. Thus, leakage of elastic waves that propagate in a direction different from the elastic wave propagation direction to the outside is reduced or prevented.

An acoustic velocity of bulk waves that propagate through the intermediate layer may be lower than an acoustic velocity of elastic waves that propagate through the piezoelectric layer, and an acoustic velocity of bulk waves that propagate through the support substrate may be higher than the acoustic velocity of elastic waves that propagate through the piezoelectric layer.

With this configuration, elastic waves that propagate from the piezoelectric layer to the intermediate layer are reflected by the interface between the support substrate and the intermediate layer and returned to the piezoelectric layer. Thus, elastic wave energy is efficiently trapped within the piezoelectric layer.

The intermediate layer may include a low acoustic velocity film and a high acoustic velocity film. An acoustic velocity of bulk waves that propagate through the low acoustic velocity film may be lower than an acoustic velocity of elastic waves that propagate through the piezoelectric layer. An acoustic velocity of bulk waves that propagate through the high acoustic velocity film may be higher than the acoustic velocity of elastic waves that propagate through the piezoelectric layer. The low acoustic velocity film may be provided between the piezoelectric layer and the support substrate. The high acoustic velocity film may be provided between the low acoustic velocity film and the support substrate.

With this configuration, elastic waves that propagate from the piezoelectric layer to the low acoustic velocity film are reflected by the interface between the high acoustic velocity film and the low acoustic velocity film and returned to the piezoelectric layer. Thus, elastic wave energy is efficiently trapped within the piezoelectric layer.

In the intermediate layer, at least one low acoustic impedance layer and at least one high acoustic impedance layer higher in acoustic impedance than the low acoustic impedance layer may be laminated, and at least one of the at least one low acoustic impedance layer may be provided closer to the piezoelectric layer than the high acoustic impedance layer.

With this configuration, elastic waves that propagate from the piezoelectric layer to the intermediate layer are reflected by the interface between the low acoustic impedance layer and the high acoustic impedance layer and returned to the piezoelectric layer. Thus, elastic wave energy is efficiently trapped within the piezoelectric layer.

The at least one groove may extend from the piezoelectric layer to a portion of the support substrate via the intermediate layer.

In this manner, when the groove extends to a portion of the support substrate, elastic waves that propagate through the piezoelectric layer and the intermediate layer are reflected by the groove. Thus, leakage of elastic waves that propagate in a direction different from the elastic wave propagation direction to the outside is reduced or prevented.

An input/output wire that is connected to the IDT electrode may be provided on the piezoelectric substrate, and the at least one groove may be provided at a location different from the input/output wire.

With this configuration, while wiring loss resulting from routing of the input/output wire is reduced, elastic waves that propagate in a direction different from the elastic wave propagation direction are reflected by the groove. Thus, leakage of elastic waves that propagate in a direction different from the elastic wave propagation direction to the outside is reduced or prevented.

An input/output wire that is connected to the IDT electrode may be provided on the piezoelectric substrate, and the input/output wire may be disposed so as to extend around the groove.

With this configuration, the length of the groove is increased, so that elastic waves propagate in a direction different from the elastic wave propagation direction are reflected in a wide range. Thus, leakage of elastic waves that propagate in a direction different from the elastic wave propagation direction to the outside is reduced or prevented.

The piezoelectric substrate may further include at least one groove extending in the perpendicular or substantially perpendicular direction. The at least one groove extending in the perpendicular or substantially perpendicular direction may be provided outside the electrode finger located at an outermost portion of the plurality of electrode fingers in the elastic wave propagation direction.

In this manner, since the elastic wave device includes the groove extends along the perpendicular or substantially perpendicular direction, elastic waves that propagate in the elastic wave propagation direction are reflected by a side surface of the groove. Thus, leakage of elastic waves that propagate in a direction different from the elastic wave propagation direction to the outside is reduced or prevented.

The at least one groove extending along the perpendicular or substantially perpendicular direction may include a plurality of grooves. The plurality of grooves may be opposite to each other in the elastic wave propagation direction.

With this configuration, since the elastic wave device includes the plurality of grooves opposite to each other in the elastic wave propagation direction, elastic waves that propagate in the elastic wave propagation direction are reflected by the grooves and trapped between the plurality of grooves. Thus, leakage of elastic waves that propagate in a direction different from the elastic wave propagation direction to the outside is reduced or prevented.

The IDT electrode may be surrounded by a plurality of the grooves extending in the elastic wave propagation direction and a plurality of the grooves extending along the perpendicular or substantially perpendicular direction.

With this configuration, elastic waves in all directions along a principal surface of the piezoelectric layer are reflected by the grooves and trapped within a region surrounded by the plurality of grooves. Thus, leakage of elastic waves that propagate in a direction different from the elastic wave propagation direction to the outside is reduced or prevented.

A front-end circuit according to a preferred embodiment of the present invention includes an elastic wave device according to a preferred embodiment of the present invention.

Thus, it is possible to provide the front-end circuit that reduces or prevents leakage of elastic waves.

A communication device according to a preferred embodiment of the present invention includes a signal processing circuit to process a radio-frequency signal and a front-end circuit according to a preferred embodiment of the present invention.

With this configuration, it is possible to provide the communication device that reduces or prevents leakage of elastic waves that propagate in a direction different from the elastic wave propagation direction.

According to preferred embodiments of the present invention, leakage of elastic waves that propagate in a direction different from an elastic wave propagation direction is reduced or prevented in elastic wave devices, radio-frequency front-end circuits, and communication devices.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
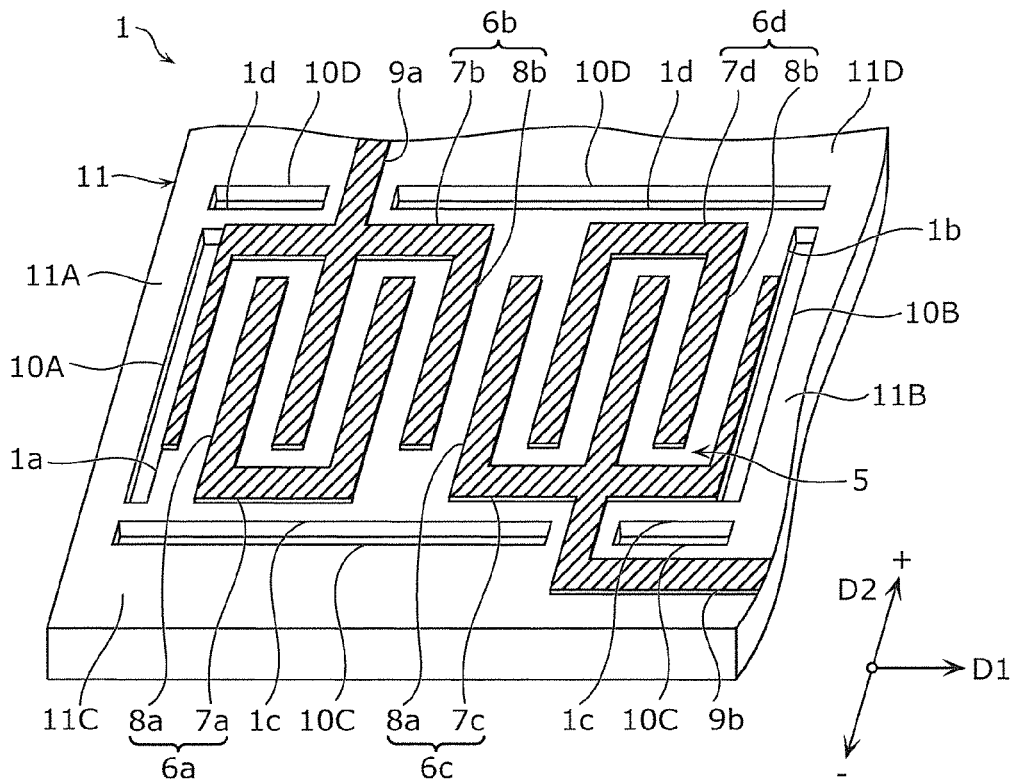
FIG. 1 is a perspective view of an elastic wave device according to a first preferred embodiment of the present invention.

Preferred embodiments of the present invention will be described in detail below with reference to the preferred embodiments and the accompanying drawings. Any of the preferred embodiments described below describes a comprehensive or specific example. Numeric values, shapes, materials, elements, disposition and connection structures of the elements, and other features, that will be described below are illustrative, and are not intended to limit the present invention. Of the elements in the following preferred embodiments, the elements not included in the independent claim will be described as optional elements. In addition, the size or size ratio of elements shown in the drawings is not necessarily strict.

First Preferred Embodiment

Figure 2A:
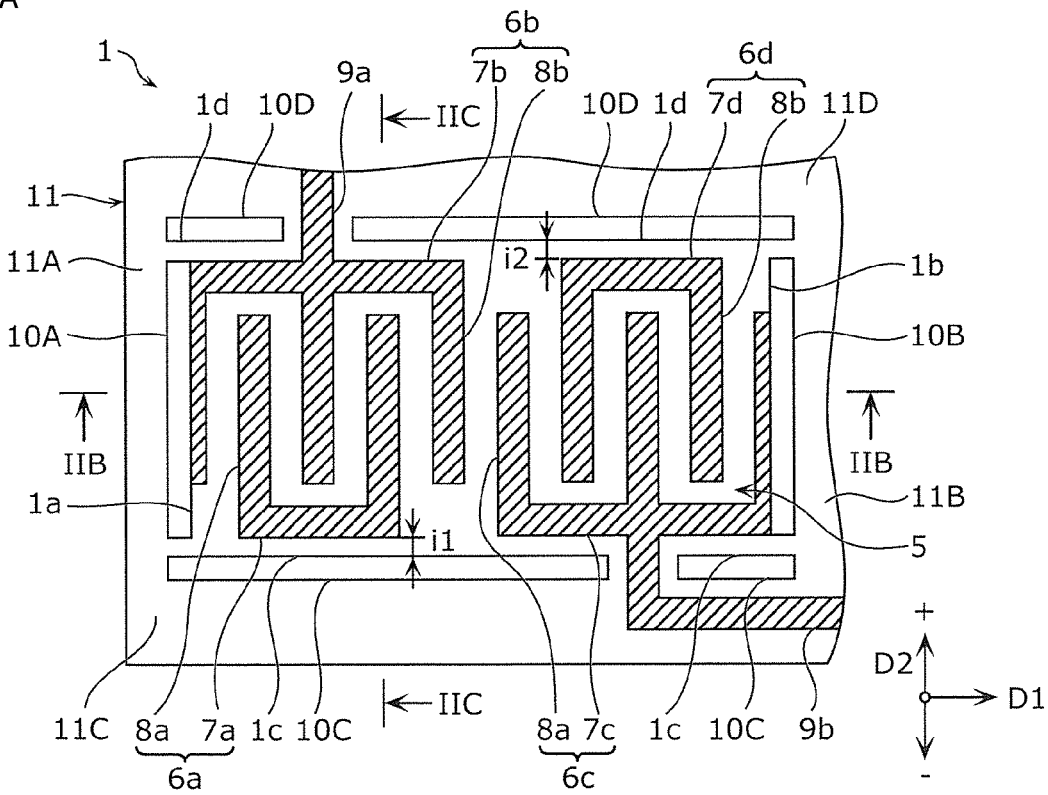
FIG. 2A is a plan view of the elastic wave device according to the first preferred embodiment of the present invention.
Figure 2B:
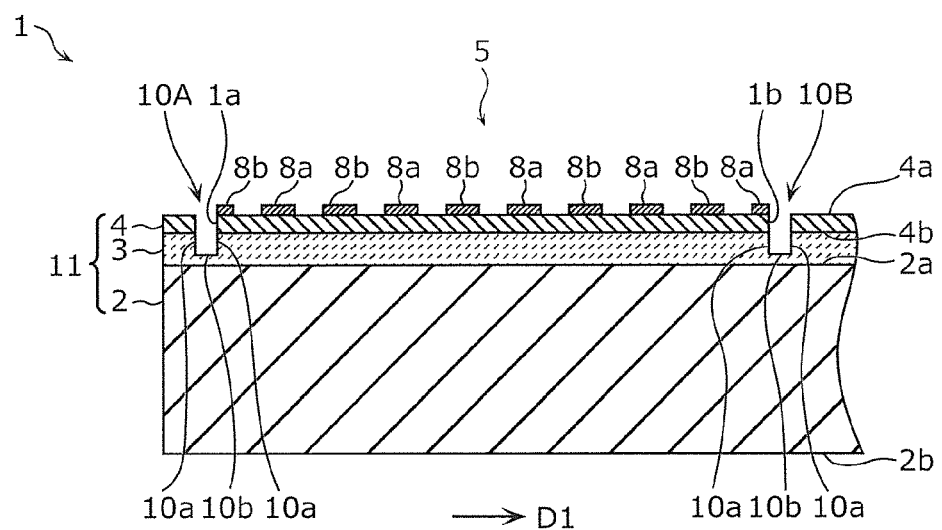
FIG. 2B is an elevational cross-sectional view that shows a cross section taken by cutting the elastic wave device of FIG. 2A along the line IIB-IIB.
Figure 2C:
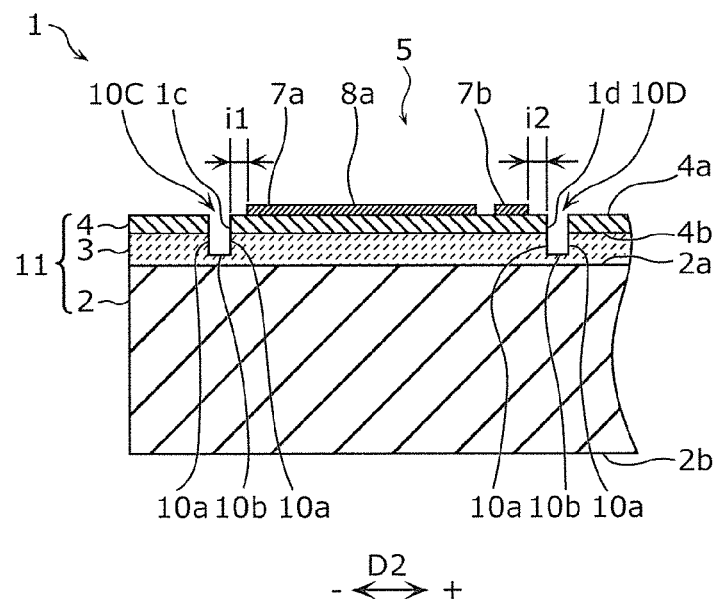
FIG. 2C is a side elevational cross-sectional view that shows a cross section taken by cutting the elastic wave device of FIG. 2A along the line IIC-IIC.

FIG. 1 is a perspective view of an elastic wave device according to a first preferred embodiment of the present invention. FIG. 2A is a plan view of the elastic wave device 1. FIG. 2B is an elevational cross-sectional view that shows a cross section taken by cutting the elastic wave device 1 of FIG. 2A along the line IIB-IIB. FIG. 2C is a side elevational cross-sectional view that shows a cross section taken by cutting the elastic wave device 1 of FIG. 2A along the line IIC-IIC.

As shown in FIG. 1, FIGS. 2A and 2B, the elastic wave device 1 includes a pair of end surfaces $1a$, $1b$ opposite to each other in an elastic wave propagation direction D1. In addition, as shown in FIG. 1, FIGS. 2A, and 2C, the elastic wave device 1 includes a pair of end surfaces $1c$, $1d$ opposite to each other in a direction D2 perpendicular or substantially perpendicular to the elastic wave propagation direction D1. The elastic wave device 1 is an end surface reflection elastic wave device in which surface acoustic waves are reflected by the end surfaces $1a$ to $1d$.

The elastic wave device 1 includes a piezoelectric substrate 11 and an IDT electrode 5. The IDT electrode 5 includes comb-shaped electrodes $6a$, $6b$, $6c$, $6d$ provided on the piezoelectric substrate 11. The piezoelectric substrate 11 includes a support substrate 2, an intermediate layer 3, and a piezoelectric layer 4. The intermediate layer 3 is provided on the support substrate 2. The piezoelectric layer 4 is provided on the intermediate layer 3. The IDT electrode 5 is provided on the piezoelectric layer 4.

As shown in FIG. 2B and FIG. 2C, the support substrate 2 includes one principal surface $2a$ and another principal surface $2b$ that are opposite to each other. The support substrate 2 is preferably made of a material through which bulk waves propagate at a higher acoustic velocity than elastic waves propagate through the piezoelectric layer 4. Examples of the material of the support substrate 2 include a semiconductor, such as Si, sapphire, $LiTaO_3$ (hereinafter, referred to as LT), $LiNbO_3$ (hereinafter, referred to as LN), and glass. These materials may be used alone or may be used in combination.

The intermediate layer 3 is provided on the one principal surface $2a$ of the support substrate 2. In addition, the intermediate layer 3 is disposed immediately below the piezoelectric layer 4 (described later), and adjoins the piezoelectric layer 4. Since the intermediate layer 3 adjoins the piezoelectric layer, leakage of the energy of elastic waves that propagate through the piezoelectric layer 4 in the thickness direction is reduced or prevented.

The intermediate layer 3 is made of a material through which bulk waves propagate at a lower acoustic velocity than elastic waves propagate through the piezoelectric layer 4. The intermediate layer 3 is preferably made of, for example, a polycrystal, amorphous, or uniaxially oriented film, and has crystal grains G1 and grain boundaries G2 (see FIG. 3).

Specifically, the intermediate layer 3 preferably includes an $SiO_2$ layer, for example. Of course, other than $SiO_2$, silicon nitride, aluminum nitride, or other suitable materials, may be used for the intermediate layer 3. These materials may be used alone or may be used in combination. In addition, from the viewpoint of improvement in adhesion with the support substrate 2, it is preferably that $SiO_2$ be used as the material for the intermediate layer 3.

The intermediate layer 3 may have a multilayer structure including a plurality of layers that are laminated.

In this case, it is preferable that a layer located closest to the support substrate 2 in the lamination direction be made of $SiO_2$, for example. Furthermore, the intermediate layer 3 may be patterned only immediately below a region through which elastic waves propagate (for example, a region in which the IDT electrode 5 and reflectors are present). The intermediate layer 3 may be provided in a region other than a region through which elastic waves propagate (for example, a region outside of the IDT electrode 5). That is, the intermediate layer 3 shown in FIGS. 2B and 2C does not need to have a uniform structure within the plane. In this case, it is preferable that the intermediate layer 3 disposed immediately below a region that propagate waves be made of an appropriate material as described above, and the intermediate layer 3 disposed outside the region that propagates elastic waves may be a selected material.

The piezoelectric layer 4 is provided on the intermediate layer 3. The piezoelectric layer 4 preferably has a thin film shape. It is preferable that the thickness of the piezoelectric layer 4 be, for example, a thickness of about $1\lambda$ where the wave length of elastic waves is $\lambda$. In this case, elastic waves are further excited.

The piezoelectric layer 4 includes one principal surface 4a and another principal surface 4b that are opposite to each other. The other principal surface 4b of the piezoelectric layer 4 is located on the intermediate layer 3 side. The piezoelectric layer 4 is preferably made of LT, for example. Another piezoelectric monocrystal, such as LN, or piezoelectric ceramic, for example, may be used as the material of the piezoelectric layer 4.

The IDT electrode 5 is provided on the one principal surface 4a of the piezoelectric layer 4. The elastic wave device 1 preferably uses surface acoustic waves, including SH waves as a main component, for example, as elastic waves that are excited by the IDT electrode 5. Of course, waves to be excited just need to be elastic waves including plate waves, such as SH waves and lamb waves (S0 mode, S1 mode, A1 mode, A0 mode), for example. Here, the plate waves collectively mean various waves that are excited by a piezoelectric thin plate having a film thickness of approximately $1\lambda$ or smaller where the wave length of the plate waves to be excited is about $1\lambda$. The following plate waves also have a similar meaning.

As shown in FIG. 1 and FIG. 2A, the pair of comb-shaped electrodes 6a, 6b that are portion of the IDT electrode 5 is opposite to each other. In addition, the pair of comb-shaped electrodes 6c, 6d that are portion of the IDT electrode 5 is opposite to each other. The comb-shaped electrode 6a includes a busbar electrode 7a and a plurality of electrode fingers 8a. The busbar electrode 7a extends in the elastic wave propagation direction D1. The plurality of electrode fingers 8a extend in the perpendicular or substantially perpendicular direction D2. The comb-shaped electrode 6b includes a busbar electrode 7b and a plurality of electrode fingers 8b. The busbar electrode 7b extends in the elastic wave propagation direction D1. The plurality of electrode fingers 8b extend in the perpendicular or substantially perpendicular direction D2. The comb-shaped electrode 6c includes a busbar electrode 7c and a plurality of electrode fingers 8a. The busbar electrode 7c extends in the elastic wave propagation direction D1. The plurality of electrode fingers 8a extend in the perpendicular or substantially perpendicular direction D2. The comb-shaped electrode 6d includes a busbar electrode 7d and a plurality of electrode fingers 8b. The busbar electrode 7d extends in the elastic wave propagation direction D1. The plurality of electrode fingers 8b extend in the perpendicular or substantially perpendicular direction D2. The plurality of electrode fingers 8a is connected to the busbar electrode 7a or the busbar electrode 7c. The plurality of electrode fingers 8b is connected to the busbar electrode 7b or the busbar electrode 7d. The plurality of electrode fingers 8a and the plurality of electrode fingers 8b are interdigitated with each other. Of the plurality of electrode fingers 8a, 8b, the width of each of the both-end electrode fingers 8a, 8b located at the outermost portions (outermost side portions) in the elastic wave propagation direction D1 is preferably about $\lambda/8$, for example. The width of each of the center electrode fingers 8a, 8b different from the both-end electrode fingers 8a, 8b is preferably $\lambda/4$, for example.

Examples of the material of the IDT electrode 5 include Cu, Ni, Ni—Cr alloy, Al—Cu alloy, appropriate metals, such as Ti, Al, and Pt, and appropriate alloys of Ti, Al, and Pt. These materials may be used alone or may be used in combination. In addition, the IDT electrode 5 may be defined by a laminated metal film provided by laminating a plurality of metal films. An $SiO_2$ film that defines and functions as a temperature regulating film may preferably be provided on the one principal surface 4a of the piezoelectric layer 4 so as to cover the IDT electrode 5. The thickness of each of the busbar electrodes 7a to 7d may preferably be larger than the thickness of each of the electrode fingers 8a, 8b.

Input/output wires 9a, 9b are provided on the piezoelectric substrate 11. The input/output wires 9a, 9b are connected to the IDT electrode 5, and supply electric power to the IDT electrode 5. Specifically, the input/output wire 9a is connected to the busbar electrode 7b of the comb-shaped electrode 6b, and the input/output wire 9b is connected to the busbar electrode 7c of the comb-shaped electrode 6c.

In the elastic wave device 1 of the present preferred embodiment, as shown in FIG. 1 and FIG. 2A, a plurality of grooves 10A, 10B and a plurality of grooves 10C, 10D are provided in the piezoelectric substrate 11.

Each of the grooves 10A, 10B extends along the perpendicular or substantially perpendicular direction D2. The grooves 10A, 10B are opposite to each other in the elastic wave propagation direction D1. Each of the grooves 10C, 10D extends along the elastic wave propagation direction D1. The grooves 10C, 10D are opposite to each other in the perpendicular or substantially perpendicular direction D2. The grooves 10A to 10D surround the IDT electrode 5. Groove outside substrate portions 11A, 11B, 11C, 11D are respectively provided outside the grooves 10A to 10D.

The groove 10A is provided outside the electrode finger 8b that is located at the outermost portion among the plurality of electrode fingers 8b in the elastic wave propagation direction D1. The groove 10B is provided outside the electrode finger 8a that is located at the outermost portion among the plurality of electrode fingers 8a in the elastic wave propagation direction D1. In addition, when the elastic wave device 1 is viewed in plan (when viewed in a direction perpendicular or substantially perpendicular to the one principal surface 4a), the groove 10A adjoins the electrode finger 8b located at the outermost portion, and the groove 10B adjoins the electrode finger 8a located at the outermost portion.

The groove 10C is provided on a side (minus side in the perpendicular or substantially perpendicular direction D2) across the busbar electrodes 7a, 7c in the perpendicular or substantially perpendicular direction D2 from a side at which the plurality of electrode fingers 8a are provided. When the groove 10C is viewed in plan, the groove 10C is parallel or substantially parallel to the busbar electrodes 7a, 7c at a predetermined distance i1 from the busbar electrodes 7a, 7c. In addition, the groove 10C is longitudinally divided into two portions, and the two portions of the groove 10C are provided at locations different from the input/output wire 9b such that the input/output wire 9b is not disposed in the groove 10C. The groove 10C may be longer than the total length of the busbar electrodes 7a, 7c.

The groove 10D is provided on a side (plus side in the perpendicular direction D2) across the busbar electrodes 7b, 7d in the perpendicular or substantially perpendicular direction D2 from a side where the plurality of electrode fingers 8b are provided. When the groove 10D is viewed in plan, the groove 10D is parallel or substantially parallel to the busbar electrodes 7b, 7d at a predetermined distance i2 from the busbar electrodes 7b, 7d. The predetermined distance i1 and the predetermined distance i2 are preferably equal or substantially equal to each other, and, for example, i1=i2=about $\lambda/8$. In addition, the groove 10D is longitudinally divided into two portions, and the two portions of the groove 10D are provided at locations different from the input/output wire 9a such that the input/output wire 9a is not disposed in the groove 10D. The groove 10D may be longer than the total length of the busbar electrodes 7b, 7d.

In addition, as shown in FIGS. 2B and 2C, each of the grooves 10A to 10D extends from the piezoelectric layer 4 to a portion of the intermediate layer 3. Specifically, each of the grooves 10A to 10D includes two side surfaces 10a and a bottom portion 10b. The bottom portion 10b does not extend to the support substrate 2. The bottom portion 10b is located between the other principal surface 4b of the piezoelectric layer 4 and the one principal surface 2a of the support substrate 2.

In the elastic wave device 1 of the present preferred embodiment, of both side surfaces 10a of the groove 10A, the side surface 10a located closer to the outermost electrode finger 8b is the end surface 1a, and, of both side surfaces 10a of the groove 10B, the side surface 10a located closer to the outermost electrode finger 8a is the end surface 1b. In addition, in the elastic wave device 1, of both side surfaces 10a of the groove 10C, the side surface 10a located closer to the busbar electrodes 7a, 7c is the end surface 1c, and, of both side surfaces 10a of the groove 10D, the side surface 10a located closer to the busbar electrodes 7b, 7d is the end surface 1d. The end surfaces 1a, 1b opposite to each other are able to reflect elastic waves that propagate in the elastic wave propagation direction D1 and trap the elastic waves between the end surfaces 1a, 1b. The end surfaces 1c, 1d opposite to each other are able to reflect elastic waves that propagate in a direction (for example, the perpendicular or substantially perpendicular direction D2) different from the elastic wave propagation direction D1 and trap the elastic waves between the end surfaces 1c, 1d. In addition, in the elastic wave device 1, the IDT electrode 5 is surrounded by the end surfaces 1a to 1d, such that elastic waves in all the directions along the one principal surface 4a of the piezoelectric layer 4 are reflected by the end surfaces 1a to 1d and trapped within a region surrounded by the end surfaces 1a to 1d.

It is preferable that the angle between the one principal surface 4a and the end surface 1a (the angle on the groove 10A side) is larger than or equal to about 70 degrees and smaller than or equal to about 90 degrees, for example. It is preferable that the angle between the one principal surface 4a and the end surface 1b (the angle on the groove 10B side) is larger than or equal to about 70 degrees and smaller than or equal to about 90 degrees, for example. In addition, it is preferable that the angle between the one principal surface 4a and the end surface 1c (the angle on the groove 10C side) is larger than or equal to about 70 degrees and smaller than or equal to about 90 degrees, for example. It is preferable that the angle between the one principal surface 4a and the end surface 1d (the angle on the groove 10D side) is larger than or equal to about 70 degrees and smaller than or equal to about 90 degrees, for example. With this structure, elastic waves are effectively trapped within the region surrounded by the end surfaces 1a to 1d.

The elastic wave device 1 may be, for example, manufactured by the following non-limiting example of a manufacturing method for the elastic wave device 1. First, a multilayer body in which the support substrate 2, the intermediate layer 3, the piezoelectric layer 4, and the IDT electrode 5 are laminated in this order is formed. Subsequently, portions corresponding to the grooves 10A to 10D in the piezoelectric layer and a portion of the intermediate layer 3 that define the multilayer body are removed by etching. The grooves 10A to 10D are formed by this etching. It is preferable that etching be performed by, for example, ICP-RIE. When etching is performed by ICP-RIE, the grooves 10A to 10D are prepared with high precision.

The elastic wave device 1 according to the present preferred embodiment includes the piezoelectric substrate 11 and the IDT electrode 5 provided on the piezoelectric substrate 11. The IDT electrode 5 includes the busbar electrodes 7a, 7c (or the busbar electrodes 7b, 7d) and the plurality of electrode fingers 8a (or the plurality of electrode fingers 8b). The busbar electrodes 7a, 7c (or the busbar electrodes 7b, 7d) extend in the elastic wave propagation direction D1. The plurality of electrode fingers 8a (or the plurality of electrode fingers 8b) are connected to the busbar electrodes 7a, 7c (or the busbar electrodes 7b, 7d), and extend in the perpendicular or substantially perpendicular direction D2 perpendicular to the elastic wave propagation direction D1. The piezoelectric substrate 11 includes at least one of the grooves 10C, 10D extending along the elastic wave propagation direction D1. The groove 10C (or the groove 10D) is provided on a side across the busbar electrodes 7a, 7c (or the busbar electrodes 7b, 7d) in the perpendicular or substantially perpendicular direction D2 from a side at which the plurality of electrode fingers 8a (or the plurality of electrode fingers 8b) is provided.

In this manner, when the grooves 10C, 10D extending along the elastic wave propagation direction D1 are provided in the piezoelectric substrate 11, elastic waves that propagate in a direction different from the elastic wave propagation direction D1 are reflected by the side surfaces 10a (end surfaces 1c, 1d) of the grooves 10C, 10D, and trapped between the grooves 10C, 10D. Thus, in the elastic wave device 1, leakage of elastic waves that propagate in a direction different from the elastic wave propagation direction to the outside is reduced or prevented.

The plurality of grooves 10C, 10D does not always need to be formed or provided in the piezoelectric substrate 11. As long as the elastic wave device 1 includes at least one groove, the elastic wave device 1 reflects and returns elastic waves that propagate in a direction different from the elastic wave propagation direction D1.

In addition, the piezoelectric substrate 11 of the elastic wave device 1 includes the support substrate 2, the piezoelectric layer 4 disposed above the support substrate 2, and the intermediate layer 3 provided between the support substrate 2 and the piezoelectric layer 4, and the IDT electrode 5 is provided on the piezoelectric layer 4. Each of the grooves 10C, 10D extends from the piezoelectric layer 4 to at least a portion of the intermediate layer 3.

In this manner, when the grooves 10C, 10D are provided in the piezoelectric layer 4 and at least a portion of the intermediate layer 3, elastic waves that propagate through the piezoelectric layer 4 and the intermediate layer 3 are reflected by the grooves 10C, 10D as compared to the case in which grooves are provided only in the piezoelectric layer 4. Thus, leakage of elastic waves that propagate in a direction different from the elastic wave propagation direction to the outside is reduced. The grooves 10C, 10D are not limited to those provided in a portion of the intermediate layer 3 in the thickness direction. The grooves 10C, 10D may have a depth to such a degree that the grooves 10C, 10D extend through the intermediate layer 3.

Figure 3:
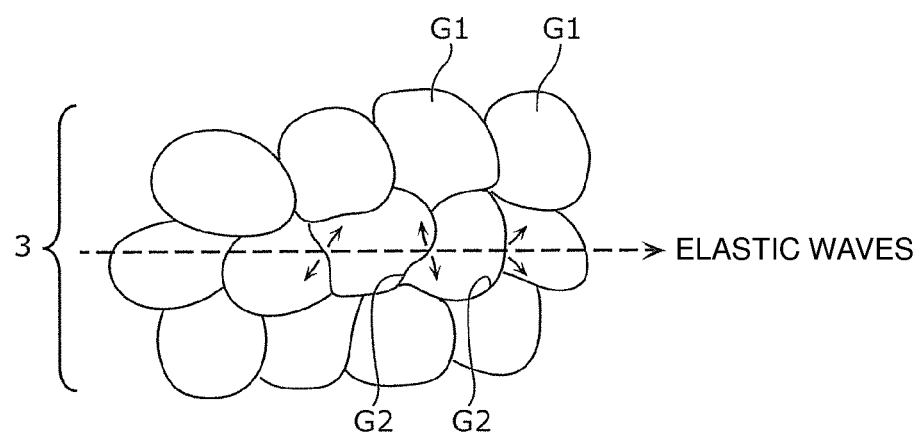
FIG. 3 is a view that shows how elastic waves propagate through an intermediate layer of the elastic wave device according to the first preferred embodiment of the present invention.

In addition, even when the intermediate layer 3 includes the crystal grains G1 and the grain boundaries G2 as shown in FIG. 3, the elastic wave device 1 of the present preferred embodiment is able to reduce leakage of elastic waves that propagate in a direction different from the elastic wave propagation direction. For example, even when a portion of elastic waves that propagate through the intermediate layer 3 are scattered by the grain boundaries G2 and the elastic waves are propagated in a direction different from the elastic wave propagation direction D1, since the elastic wave device 1 includes the grooves 10C, 10D, the elastic waves are reflected by the grooves 10C, 10D, and elastic wave energy is trapped between the grooves 10C, 10D.

In addition, the IDT electrode 5 of the elastic wave device 1 is surrounded by the plurality of grooves 10C, 10D extending along the elastic wave propagation direction D1 and the plurality of grooves 10A, 10B extending along the perpendicular or substantially perpendicular direction D2.

Thus, elastic waves in all directions along the one principal surface 4a of the piezoelectric layer 4 are reflected by the side surfaces of the grooves 10A to 10D, so leakage of elastic waves is reduced or prevented.

In addition, the elastic wave device 1 has a structure such that the grooves 10A to 10D do not extend to the other principal surface 2b of the support substrate 2 and the elastic wave device 1 is not separated. That is, the elastic wave device 1 includes the groove outside substrate portions 11A, 11B, 11C, 11D outside of the grooves 10A to 10D, respectively. The groove outside substrate portions 11A to 11D adjoin the piezoelectric substrate 11, and are preferably made of the same material as the piezoelectric substrate 11. For example, when the piezoelectric substrate 11 is used as a mounting substrate, other elements or circuit portions may be provided on the groove outside substrate portions 11A to 11D. Therefore, with the elastic wave device 1, re-connection to other elements or circuit portions is not required, so electrical connection is simplified. In addition, since other elements or circuit portions may be provided on the groove outside substrate portions 11A to 11D, an electronic component on which the elastic wave device 1 is mounted is reduced in size or miniaturized.

Figure 4:
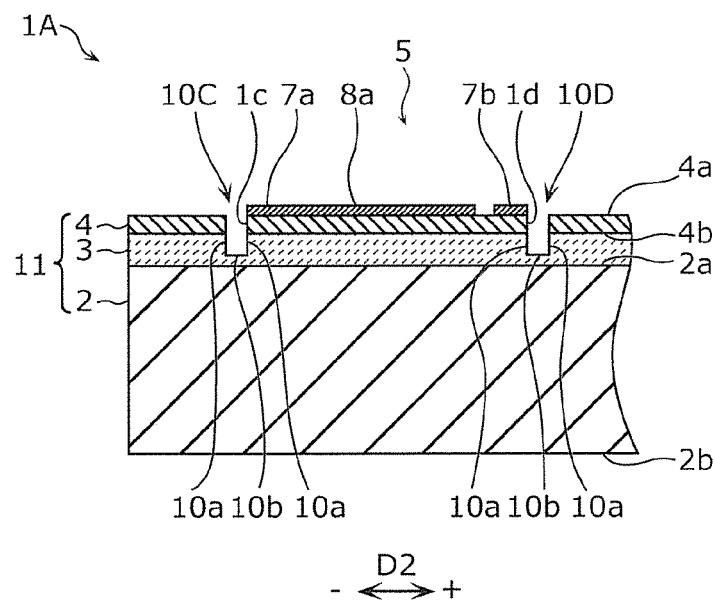
FIG. 4 is a side elevational cross-sectional view of an elastic wave device according to a first modification of the first preferred embodiment of the present invention.

FIG. 4 is a side elevational cross-sectional view of an elastic wave device 1A according to a first modification of the first preferred embodiment.

In the elastic wave device 1A of the first modification, the end surface 1c of the groove 10C is in proximity to the busbar electrodes 7a, 7c so as to be flush with the side surfaces of the busbar electrodes 7a, 7c. In addition, the end surface 1d of the groove 10D is in proximity to the busbar electrodes 7b, 7d so as to be flush with the side surfaces of the busbar electrodes 7b, 7d.

In this manner, when the groove 10C is in proximity to the busbar electrodes 7a, 7c and the groove 10D is in proximity to the busbar electrodes 7b, 7d, the elastic wave device 1A is miniaturized. In addition, since elastic waves that propagate in a direction different from the elastic wave propagation direction D1 are reflected at the locations close to the busbar electrodes 7a to 7d, elastic waves are efficiently trapped.

Figure 5:
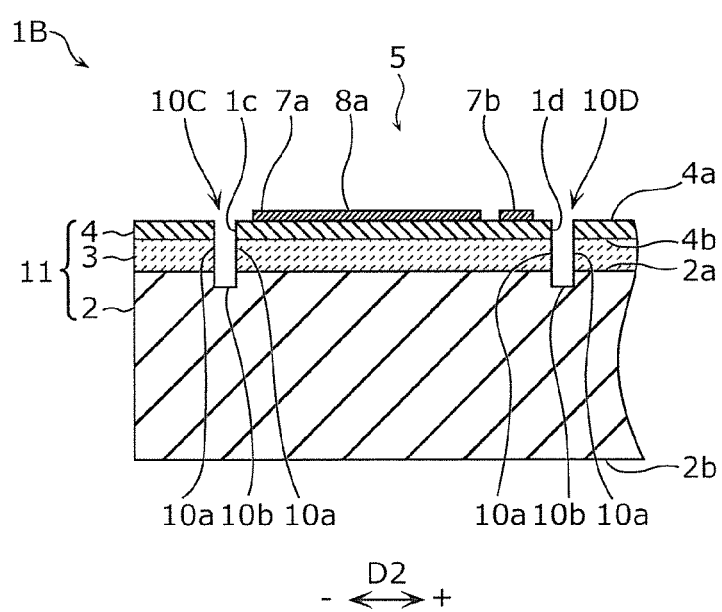
FIG. 5 is a side elevational cross-sectional view of an elastic wave device according to a second modification of the first preferred embodiment of the present invention.

FIG. 5 is a side elevational cross-sectional view of an elastic wave device 1B according to a second modification of the first preferred embodiment.

In the elastic wave device 1B of the second modification, each of the grooves 10C, 10D extends from the piezoelectric layer 4 to a portion of the support substrate 2 via the intermediate layer 3. Specifically, each of the grooves 10C, 10D extends from the one principal surface 4a of the piezoelectric layer 4 to a depth between the one principal surface 2a and the other principal surface 2b of the support substrate 2.

For example, when the materials of the piezoelectric layer 4, intermediate layer 3, and support substrate 2 are different from one another, a strain caused by a temperature change more easily occurs because of a difference in the coefficient of linear expansion among the materials. In contrast to this, in the elastic wave device 1B of the second modification, since the grooves 10C, 10D extend to a portion of the support substrate 2, a strain caused by a temperature change is reduced. In addition, when elastic waves propagate to the support substrate 2, the efficiency of trapping elastic waves is further improved by extending the grooves 10C, 10D to a portion of the support substrate 2.

In the elastic wave device 1B, the intermediate layer 3 may preferably include a low acoustic velocity film 34, and the support substrate 2 may preferably include a high acoustic velocity support substrate.

The low acoustic velocity film is a film through which bulk waves propagate at a lower acoustic velocity than elastic waves propagate through the piezoelectric layer 4. The high acoustic velocity support substrate is a support substrate through which bulk waves propagate at a higher acoustic velocity than elastic waves propagate through the piezoelectric layer 4.

Specifically, the low acoustic velocity film of which the acoustic velocity is relatively low is laminated on the high acoustic velocity support substrate, and the piezoelectric layer is laminated on the low acoustic velocity film. In the intermediate layer 3, the low acoustic velocity film may be patterned in a region through which elastic waves propagate (for example, only immediately below a region in which the IDT electrode and reflectors are disposed). An appropriate material (for example, $SiO_2$) may be provided in a region other than a region through which elastic waves propagate (for example, an outside region of the IDT electrode 5). In addition, an appropriate material may be provided between the intermediate layer 3 and the high acoustic velocity support substrate.

The above-described high acoustic velocity support substrate traps elastic wave energy within the high acoustic velocity support substrate. That is, elastic wave energy is also able to be trapped within an upper-side region above the high acoustic velocity support substrate (a region including the piezoelectric layer and the low acoustic velocity film).

The low acoustic velocity film is preferably made of, for example, any one of silicon oxide, glass, silicon oxynitride, tantalum oxide, a chemical compound obtained by adding fluorine, carbon, or boron to silicon oxide, and a material containing any one of the above materials as a main ingredient.

The high acoustic velocity support substrate is preferably made of, for example, any one of piezoelectric bodies, such as aluminum nitride, aluminum oxide, silicon carbide, silicon nitride, silicon, sapphire, lithium tantalate, lithium niobate, and crystal, various ceramics, such as alumina, zirconia, cordierite, mullite, steatite, and forsterite, magnesia diamond, a material containing any one of the above materials as a main ingredient, and a material containing a mixture of some of the above materials as a main ingredient.

In the elastic wave device 1B, the grooves 10A to 10D extend from the one principal surface 4a of the piezoelectric layer 4 to a portion of the high acoustic velocity support substrate via the low acoustic velocity film. In the case of the structure in which the intermediate layer 3 includes a low acoustic velocity film as in the case of the present preferred embodiment, since elastic wave energy is trapped within an upper-side region above the high acoustic velocity support substrate (a region including the piezoelectric layer 4 and the low acoustic velocity film), it is preferable that the grooves 10A to 10D extend up to a portion of the high acoustic velocity support substrate.

In a non-limiting example of a method of forming the grooves 10C, 10D in the elastic wave device 1B, first, portions corresponding to the grooves 10C, 10D in the piezoelectric layer and the intermediate layer 3 are removed by etching. Subsequently, portions corresponding to the grooves 10C, 10D in a portion of the support substrate 2 are removed by cutting with a dicing machine. Thus, the grooves 10C, 10D are formed. As a result, the grooves 10C, 10D are formed so as to extend from the piezoelectric layer 4 to a portion of the support substrate 2.

Second Preferred Embodiment

Figure 6:
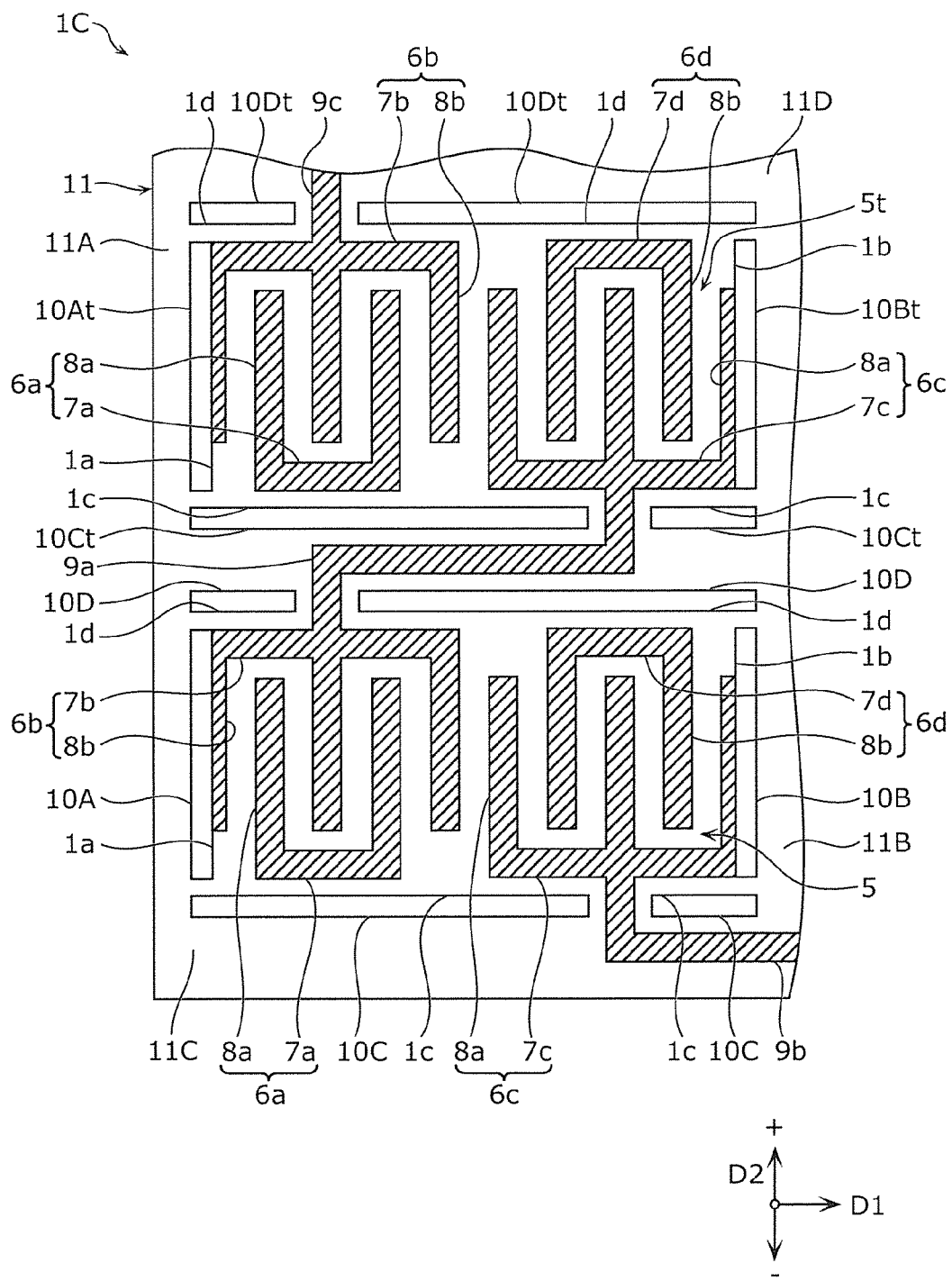
FIG. 6 is a plan view of an elastic wave device according to a second preferred embodiment of the present invention.

FIG. 6 is a plan view of an elastic wave device 1C according to a second preferred embodiment of the present invention.

In the elastic wave device 1C, two IDT electrodes 5, 5t are disposed next to each other in the perpendicular or substantially perpendicular direction D2. The grooves 10A, 10B, 10C, 10D are provided for the IDT electrode 5. Grooves 10At, 10Bt, 10Ct, 10Dt are provided for the other IDT electrode 5t.

The configuration of the other IDT electrode 5t is the same or substantially the same as that of the IDT electrode 5 of the first preferred embodiment, so redundant description is omitted. In addition, the configuration of each of the grooves 10At, 10Bt, 10Ct, 10Dt associated with the other IDT electrode 5t is the same or substantially the same as that of each of the grooves 10A, 10B, 10C, 10D of the first preferred embodiment, and redundant description is omitted.

In the elastic wave device 1C, the IDT electrodes 5, 5t are connected in series with each other via the input/output wire 9a. Specifically, the comb-shaped electrode 6b of the IDT electrode 5 and the comb-shaped electrode 6c of the IDT electrode 5t are connected to each other by the input/output wire 9a. In addition, the input/output wire 9b is connected to the comb-shaped electrode 6c of the IDT electrode 5. The input/output wire 9c is connected to the comb-shaped electrode 6b of the IDT electrode 5t.

The groove 10Ct is provided such that the input/output wire 9a is not disposed in the groove 10Ct. The groove 10Dt is provided such that the input/output wire 9c is not disposed in the groove 10Dt. That is, the groove 10Ct is provided at the locations different from the input/output wire 9a, and the groove 10Dt is provided at the locations different from the input/output wire 9c.

The elastic wave device 1C according to the present preferred embodiment includes the piezoelectric substrate 11, the IDT electrode 5, and the IDT electrode 5t. The IDT electrodes 5, 5t are provided on the piezoelectric substrate 11. Each of the IDT electrodes 5, 5t includes the busbar electrodes 7a, 7c (or the busbar electrodes 7b, 7d) and the plurality of electrode fingers 8a (or the plurality of electrode fingers 8b). The busbar electrodes 7a, 7c (or the busbar electrodes 7b, 7d) extend in the elastic wave propagation direction D1. The plurality of electrode fingers 8a (or the plurality of electrode fingers 8b) are connected to the busbar electrodes 7a, 7c (or the busbar electrodes 7b, 7d), and extend in the perpendicular or substantially perpendicular direction D2 perpendicular or substantially perpendicular to the elastic wave propagation direction D1. The piezoelectric substrate 11 includes the plurality of grooves 10C, 10D and the plurality of grooves 10Ct, 10Dt. The plurality of grooves 10C, 10D and the plurality of grooves 10Ct, 10Dt are disposed along the elastic wave propagation direction D1. Each of the plurality of grooves 10C, 10D (or the plurality of grooves 10Ct, 10Dt) is provided on a side across the busbar electrodes 7a, 7c (or 7b, 7d) in the perpendicular or substantially perpendicular direction D2 from a side at which the plurality of electrode fingers 8a (or the plurality of electrode fingers 8b) are disposed.

In this manner, even when the two IDT electrodes 5, 5t are provided, but when the grooves 10C, 10D are provided for the IDT electrode 5 and the grooves 10Ct, 10Dt are provided for the IDT electrode 5t, elastic waves that propagate in a direction different from the elastic wave propagation direction D1 are reflected by the end surfaces 1c, 1d of the grooves 10C, 10D or the end surfaces 1c, 1d of the grooves 10Ct, 10Dt, and trapped between the grooves 10C, 10D or between the grooves 10Ct, 10Dt. Thus, leakage of elastic waves to the outside is reduced or prevented.

Third Preferred Embodiment

Figure 7A:
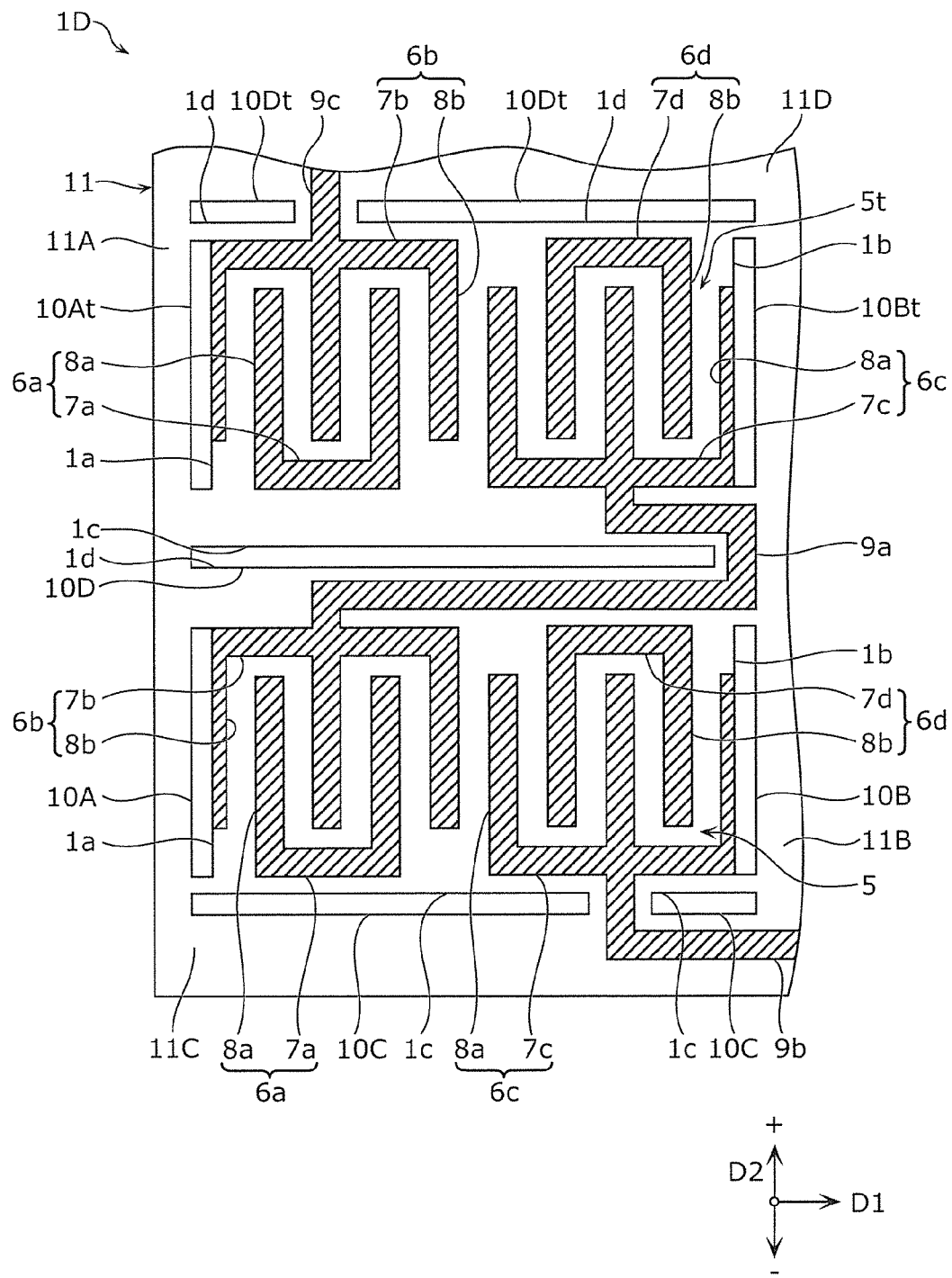
FIG. 7A is a plan view of an elastic wave device according to a third preferred embodiment of the present invention.

FIG. 7A is a plan view of an elastic wave device 1D according to a third preferred embodiment of the present invention.

In the elastic wave device 1D, the input/output wire 9a is disposed so as to extend around the groove 10D. The configuration of each of the IDT electrodes 5, 5t in the elastic wave device 1D is the same or substantially the same as that of the second preferred embodiment, and redundant description is omitted.

In the elastic wave device 1D, the single groove 10D is located between the one IDT electrode 5 and the other IDT electrode 5t, and the groove 10D is used by the IDT electrode 5 and the IDT electrode 5t. The comb-shaped electrode 6b of the IDT electrode 5 and the comb-shaped electrode 6c of the IDT electrode 5t are connected by the input/output wire 9a. The input/output wire 9a is disposed so as to extend around the groove 10D.

The elastic wave device 1D according to the present preferred embodiment includes the plurality of grooves 10C, 10D, 10Dt along the elastic wave propagation direction D1. Each of the plurality of grooves 10C, 10D (or the plurality of grooves 10D, 10Dt) is provided on a side across the busbar electrodes 7a, 7c (or the busbar electrodes 7b, 7d) in the perpendicular or substantially perpendicular direction D2 from a side at which the plurality of electrode fingers 8a (or the plurality of electrode fingers 8b) is provided.

In this manner, even when the two IDT electrodes 5, 5t are provided, but when the grooves 10C, 10D are provided for the IDT electrode 5 and the grooves 10D, 10Dt are provided for the IDT electrode 5t, elastic waves that propagate in a direction different from the elastic wave propagation direction D1 are reflected by the end surfaces 1c, 1d of the grooves 10C, 10D or the end surfaces 1c, 1d of the grooves 10D, 10Dt, and trapped between the grooves 10C, 10D or between the grooves 10D, 10Dt. Thus, leakage of elastic waves to the outside is reduced or prevented.

Figure 7B:
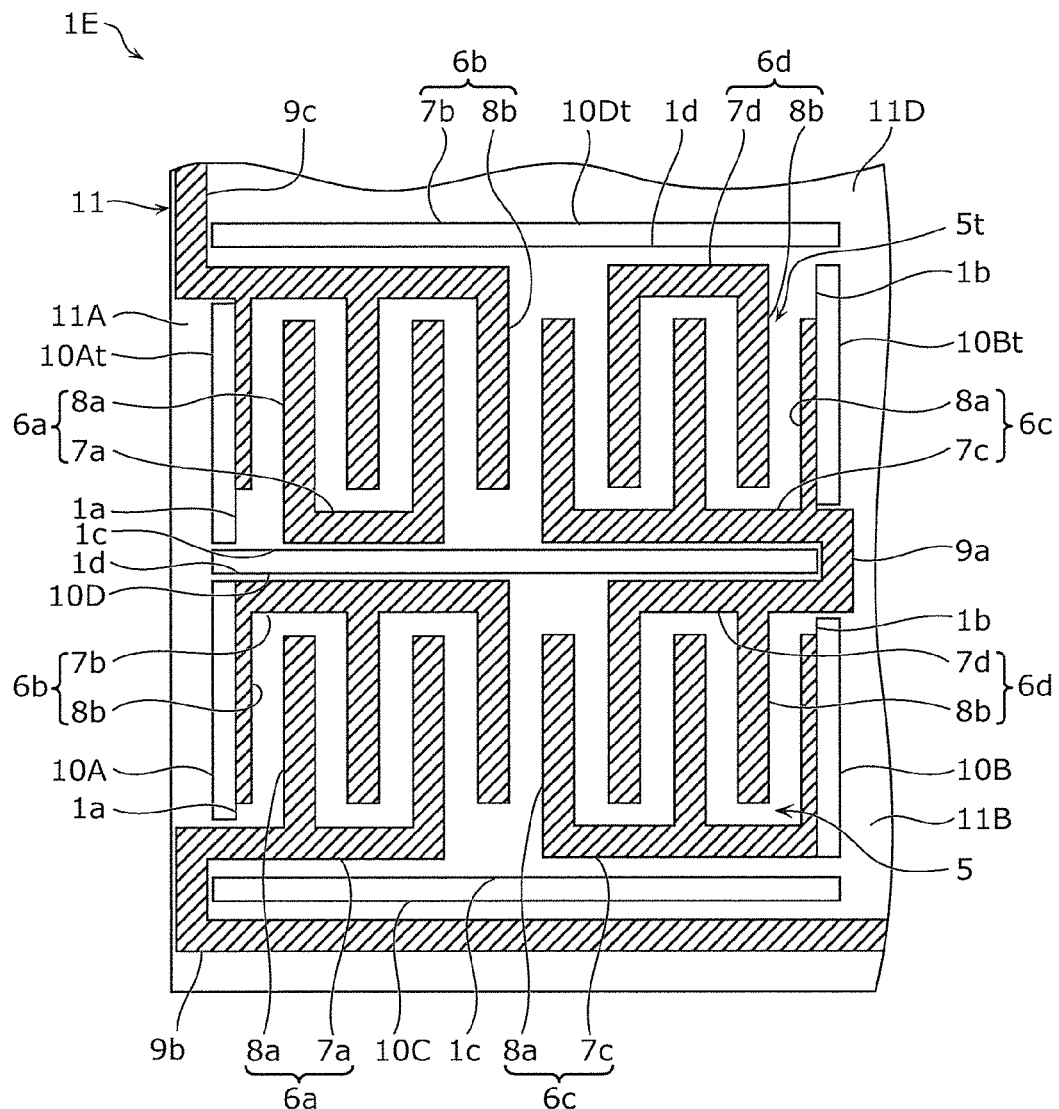
FIG. 7B is a plan view of an elastic wave device according to a modification of the third preferred embodiment of the present invention.
Figure 7B:
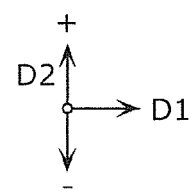

FIG. 7B is a plan view of an elastic wave device 1E according to a modification of the third preferred embodiment.

In the elastic wave device 1E of the modification, the input/output wires are routed from the busbar electrodes and extend around the grooves 10C, 10D, 10Dt. Each of the grooves 10C, 10D, 10Dt is defined by a single groove.

Specifically, the input/output wire 9b is routed from the busbar electrode 7a of the IDT electrode 5, and extends around the groove 10C. The input/output wire 9a is routed from the busbar electrode 7c of the IDT electrode 5t, extends around the groove 10D, and is connected to the busbar electrode 7d of the IDT electrode 5. The input/output wire 9c extends around the groove 10Dt, and is connected to the busbar electrode 7b of the IDT electrode 5t.

In the elastic wave device 1E of the modification, the grooves 10C, 10D are provided for the IDT electrode 5 and the grooves 10D, 10Dt are provided for the IDT electrode 5t, so elastic waves that propagate in a direction different from the elastic wave propagation direction D1 are reflected by the end surfaces 1c, 1d of the grooves 10C, 10D or the end surfaces 1c, 1d of the grooves 10D, 10Dt, and trapped between the grooves 10C, 10D or between the grooves 10D, 10Dt. Thus, leakage of elastic waves to the outside is reduced or prevented.

In addition, the single groove 10D is shared between the IDT electrodes 5, 5t, so the dimension of the elastic wave device 1E in the perpendicular or substantially perpendicular direction D2 is reduced, with the result that the elastic wave device 1E is reduced in size or miniaturized.

Fourth Preferred Embodiment

Figure 8:
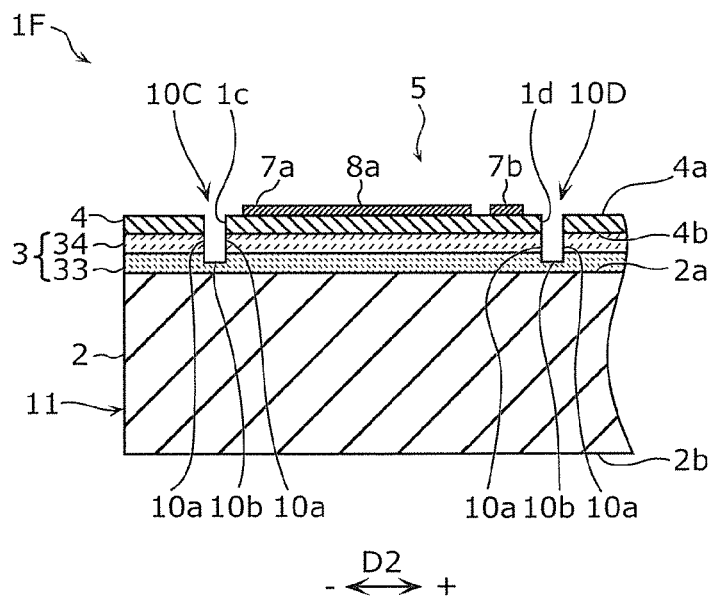
FIG. 8 is a side elevational cross-sectional view of an elastic wave device according to a fourth preferred embodiment of the present invention.

FIG. 8 is a side elevational cross-sectional view of an elastic wave device 1F according to a fourth preferred embodiment of the present invention. This side elevational cross-sectional view is a side view when the elastic wave device 1F is cut along the same or substantially the same position as that of the cross section shown in FIG. 2C.

As shown in FIG. 8, in the elastic wave device 1F, the intermediate layer 3 includes a high acoustic velocity film 33 and a low acoustic velocity film 34. Specifically, the high acoustic velocity film 33 having a relatively high acoustic velocity is laminated on the support substrate 2, the low acoustic velocity film 34 having a relatively low acoustic velocity is laminated on the high acoustic velocity film 33, and the piezoelectric layer 4 is laminated on the low acoustic velocity film 34. In the intermediate layer 3, the high acoustic velocity film 33 and the low acoustic velocity film 34 may be patterned in a region through which elastic waves propagate (for example, only immediately below a region in which the IDT electrode 5 and reflectors are disposed). Other than the region through which elastic waves propagate (for example, other than an outside region of the IDT electrode 5), an appropriate material, such as $SiO_2$, for example, may be provided. In addition, an appropriate material may be provided between the intermediate layer 3 and the support substrate 2.

The high acoustic velocity film 33 traps elastic waves within a portion at which the piezoelectric layer 4 and the low acoustic velocity film 34 are laminated so that elastic waves do not leak to a lower-side portion below the high acoustic velocity film 33. The high acoustic velocity film 33 is preferably made of, for example, aluminum nitride. As long as the elastic waves are trapped, various high acoustic velocity materials, such as aluminum nitride, aluminum oxide, silicon carbide, silicon nitride, silicon oxynitride, a DLC film, diamond, a medium containing any one of these materials as a main ingredient, and a medium containing a mixture of some of these materials as a main ingredient, may be used. To trap elastic waves within a portion at which the piezoelectric layer 4 and the low acoustic velocity film 34 are laminated, it is preferable that the film thickness of the high acoustic velocity film 33 is larger, it is more preferable that the film thickness of the high acoustic velocity film 33 is, for example, larger than or equal to about 0.1 times of the wave length λ of elastic waves, and, furthermore, it is more preferable that the film thickness of the high acoustic velocity film 33 is, for example, larger than or equal to about one and a half times of the wave length λ.

The low acoustic velocity film 34 is preferably made of silicon oxide. Of course, an appropriate material through which bulk waves propagate at a lower acoustic velocity than bulk waves propagate through the piezoelectric layer 4 may be used as the material for the low acoustic velocity film 34. Examples of such a material include media containing any one of silicon oxide, glass, silicon oxynitride, tantalum oxide, and a compound obtained by adding fluorine, carbon, or boron to silicon oxide, as a main ingredient.

The high acoustic velocity film 33 means a film through which bulk waves propagate through the high acoustic velocity film at a higher acoustic velocity than elastic waves, such as surface waves and boundary waves, for example, propagate through the piezoelectric layer 4.

In addition, the low acoustic velocity film 34 is a film through which bulk waves propagate through the low acoustic velocity film 34 at a lower acoustic velocity than bulk waves propagate through the piezoelectric layer 4.

In the elastic wave device 1F, the grooves 10A to 10D extend from the one principal surface 4a of the piezoelectric layer 4 to a portion of the high acoustic velocity film 33 via the low acoustic velocity film 34.

When the intermediate layer 3 has the structure in which the low acoustic velocity film 34 is laminated on the high acoustic velocity film 33 as in the case of the present preferred embodiment, it is preferable that the grooves 10A to 10D extend to a portion of the high acoustic velocity film 33.

In this manner, when the piezoelectric substrate 11 includes the piezoelectric layer 4, the low acoustic velocity film 34, the high acoustic velocity film 33, and support substrate 2 elastic waves that propagate from the piezoelectric layer 4 to the low acoustic velocity film 34 are reflected by the interface between the high acoustic velocity film 33 and the low acoustic velocity film 34 and returned to the piezoelectric layer 4. Thus, elastic wave energy is efficiently trapped within the piezoelectric layer 4.

Fifth Preferred Embodiment

Figure 9:
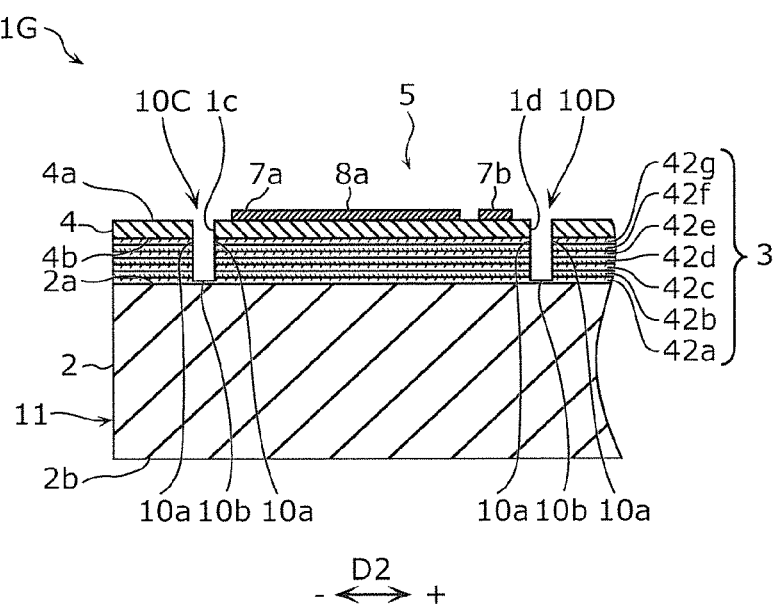
FIG. 9 is a side elevational cross-sectional view of an elastic wave device according to a fifth preferred embodiment of the present invention.

FIG. 9 is a side elevational cross-sectional view of an elastic wave device 1G according to a fifth preferred embodiment of the present invention. This side elevational cross-sectional view is a side view when the elastic wave device 1G is cut along the same or substantially the same position as that of the cross section shown in FIG. 2C.

As shown in FIG. 9, in the elastic wave device 1G, the intermediate layer 3 defines and functions as an acoustic reflection layer including a plurality of acoustic impedance layers. Specifically, the intermediate layer 3 includes low acoustic impedance layers 42a, 42c, 42e, 42g, and high acoustic impedance layers 42b, 42d, 42f. In the intermediate layer 3, the low acoustic impedance layers 42a, 42c, 42e, 42g and the high acoustic impedance layers 42b, 42d, 42f are patterned in a region through which elastic waves propagate (for example, only immediately below a region in which the IDT electrode 5 and reflectors are present). Other than the region through which elastic waves propagate (for example, a region outside of the IDT electrode 5), an appropriate material, such as SiO$_2$, for example may be provided. In addition, an appropriate material may be provided between the intermediate layer 3 and the support substrate 2.

The acoustic impedance of each of the high acoustic impedance layers 42b, 42d, 42f is higher than the acoustic impedance of each of the low acoustic impedance layers 42a, 42c, 42e, 42g. In the elastic wave device 1G, the low acoustic impedance layer 42a is laminated on the one principal surface 2a of the support substrate 2, and the high acoustic impedance layers 42b, 42d, 42f and the low acoustic impedance layers 42c, 42e, 42g are alternately disposed on or above the low acoustic impedance layer 42a in the lamination direction.

Therefore, elastic waves that propagate from the piezoelectric layer 4 to the intermediate layer 3 are reflected by the interfaces on the high acoustic impedance layers 42b, 42d, 42f that are respectively surfaces above the low acoustic impedance layers 42a, 42c, 42e, and returned to the piezoelectric layer 4. Thus, elastic wave energy is efficiently trapped within the piezoelectric layer 4.

The low acoustic impedance layers 42a, 42c, 42e, 42g are preferably made of SiO$_2$, for example. The low acoustic impedance layers 42a, 42c, 42e, 42g may be made of Al, or other materials. These materials may be used alone or may be used in combination.

The high acoustic impedance layers 42b, 42d, 42f are preferably made of SiN, for example. The high acoustic impedance layers 42b, 42d, 42f may be made of W, Pt, LT, Al$_2$O$_3$, Ta$_2$O$_5$, LN, AlN, ZnO, or other materials. These materials may be used alone or may be used in combination.

In the elastic wave device 1G, the layer located closest to the support substrate 2 in the lamination direction is the low acoustic impedance layer 42a preferably made of SiO$_2$, for example. Therefore, in the elastic wave device 1G, adhesion between the intermediate layer 3 and the support substrate 2 is improved.

In addition, for example, even when the low acoustic impedance layer 42a located closest to the support substrate 2 is made of SiO$_2$ including the crystal grains G1 and the grain boundaries G2, since the elastic wave device 1G includes the grooves 10C, 10D, elastic waves that propagate in a direction different from the elastic wave propagation direction D1 are reflected and trapped between the grooves 10C, 10D.

In addition, in the elastic wave device 1G, the grooves 10A to 10D extend from the one principal surface 4a of the piezoelectric layer 4 to a portion of the low acoustic impedance layer 42a.

Since elastic waves that propagate from the piezoelectric layer 4 to the intermediate layer 3 are reflected by the interfaces on the high acoustic impedance layers 42b, 42d, 42f that are respectively the surfaces above the low acoustic impedance layers 42a, 42c, 42e and returned to the piezoelectric layer 4, the grooves are not required to extend to the support substrate 2.

When the intermediate layer 3 has a multilayer structure as in the case of the present preferred embodiment, it is preferable that the grooves 10A to 10D extend to a portion of the layer located closest to the support substrate 2 in the lamination direction.

In the elastic wave device 1G, the grooves 10A to 10D may extend from the one principal surface 4a of the piezoelectric layer 4 to between the one principal surface 2a and the other principal surface 2b of the support substrate 2. When the materials of the piezoelectric layer 4, intermediate layer 3, and support substrate 2 are different from one another, a strain caused by a temperature change easily occurs because of a difference in the coefficient of linear expansion among the materials. However, since the grooves 10A to 10D extend to a portion of the support substrate 2, a strain caused by a temperature change is reduced.

In the present preferred embodiment, the number of laminated low acoustic impedance layers and the number of laminated high acoustic impedance layers are not specifically limited. In addition, the low acoustic impedance layer and the high acoustic impedance layer do not need to be disposed alternately in the lamination direction. Of course, from the viewpoint of improving the efficiency of trapping elastic waves within the piezoelectric layer 4, it is preferable that at least one low acoustic impedance layer is provided closer to the piezoelectric layer 4 than at least one high acoustic impedance layer.

Sixth Preferred Embodiment

Figure 10:
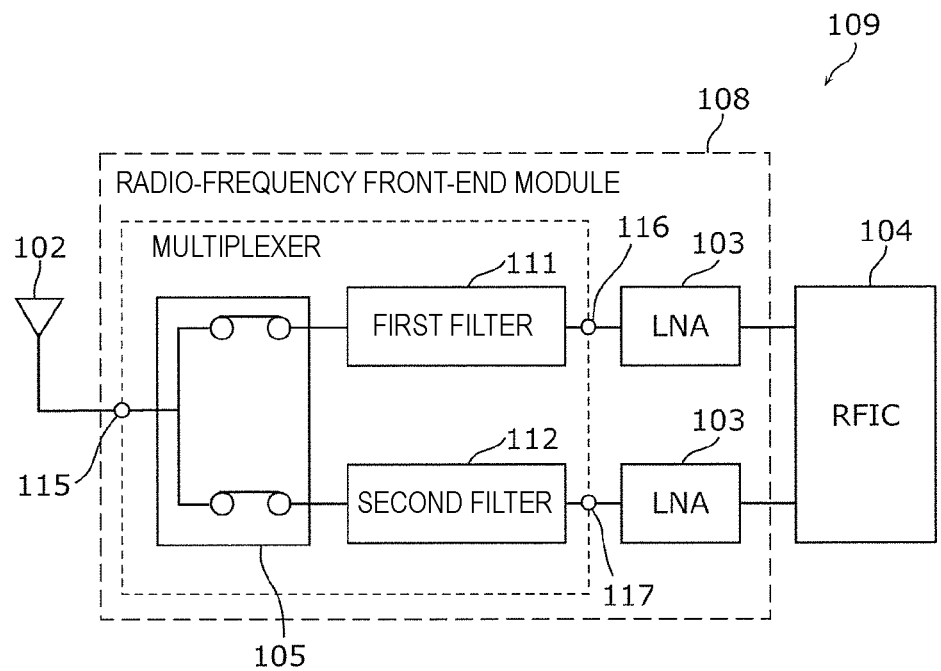
FIG. 10 is a circuit configuration diagram that shows a front-end circuit and a communication device according to a sixth preferred embodiment of the present invention.

FIG. 10 is a circuit configuration diagram that shows a front-end circuit 108 and a communication device 109 according to a sixth preferred embodiment of the present invention.

In the front-end circuit 108 and the communication device 109, the elastic wave device 1 according to the first preferred embodiment is included in each of a first filter 111 and a second filter 112.

In the front-end circuit 108 and the communication device 109, shown in FIG. 10, to amplify input signals, a low noise amplifier (LNA) 103 is provided between a first terminal 116 and an RFIC 104 and between a second terminal 117 and the RFIC 104. In addition, to switch a connection status with an antenna element 102, a multiport switch 105 is provided between the first filter 111 and an antenna common terminal 115 and between the second filter 112 and the antenna common terminal 115. The multiport switch 105 is able to be turned on or off at the same time. When the first filter 111 is connected to the antenna common terminal 115, that is, when the first filter 111 is performing signal processing, the multiport switch 105 is able to also have the second filter 112 connected to the antenna common terminal 115.

With the front-end circuit 108 and communication device 109 having such a circuit configuration, leakage of elastic waves is reduced or prevented as in the case of the above-described preferred embodiments.

In addition, in the present preferred embodiment, the first filter 111 defines and functions as a receiving filter. However, the first filter 111 is not limited to the receiving filter. The first filter 111 including the elastic wave device 1 may be used as a transmission filter. For example, when the LNA 103 located between the RFIC 104 and the first filter 111 that is the transmission filter is replaced by a power amplifier (PA), the communication device 109 may be configured to be able to transmit or receive signals.

In addition, each of the filters included in the front-end circuit 108 and the communication device 109 is not limited to a surface acoustic wave filter, and may be a boundary acoustic wave filter, for example. With this configuration as well, similar advantageous effects to those of the elastic wave device 1 and other elastic wave devices according to the above-described preferred embodiments are obtained.

The elastic wave devices 1 to 1G, the front-end circuit 108, and the communication device 109 according to preferred embodiments of the present invention and modifications thereof have been described. However, the present invention is not limited to the above-described preferred embodiments and modifications thereof. The present invention also encompasses other preferred embodiments provided by combining selected elements of the above-described preferred embodiments and modifications thereof, alternative preferred embodiments obtained by applying various modifications that are conceived of by persons skilled in the art to the above-described preferred embodiments without departing from the scope of the present invention, and various devices that include the elastic wave device according to preferred embodiments of the present invention.

Figure 11:
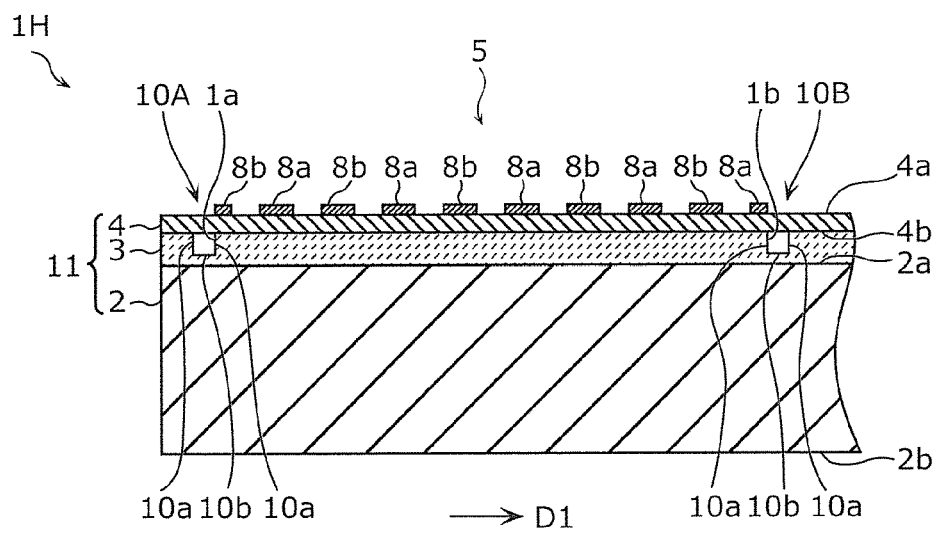
FIG. 11 is a side elevational cross-sectional view of an elastic wave device according to another preferred embodiment of the present invention.

FIG. 11 is a side elevational cross-sectional view of an elastic wave device 1H according to another preferred embodiment of the present invention. This side elevational cross-sectional view is a side view when the elastic wave device 1H is cut along the same or substantially the same position as that of the cross section shown in FIG. 2B.

In the elastic wave device 1H, each of the grooves 10A, 10B is provided only in the intermediate layer 3. Specifically, the grooves 10A, 10B are not provided in the piezoelectric layer 4, but the grooves 10A, 10B are provided in a portion of the intermediate layer 3. In the elastic wave device 1H, the grooves 10A, 10B are provided in the intermediate layer 3 of the piezoelectric substrate 11, elastic waves that propagate in the elastic wave propagation direction D1 are reflected by the end surface 1a of the groove 10A and the end surface 1b of the groove 10B, and elastic waves are trapped between the groove 10A and the groove 10B.

With this structure, routing of wires is facilitated, and reflectors are able to be provided on the piezoelectric substrate 11. In addition, the grooves 10A, 10B are able to be disposed inside the IDT electrode 5, so the trapping efficiency is improved. In addition, since the intermediate layer 3 is sealed by the piezoelectric layer 4, for example, when the intermediate layer 3 is made of $SiO_2$, degradation of the intermediate layer 3 is reduced. The grooves 10A, 10B are preferably provided only in at least a portion of the intermediate layer 3.

Figure 12:
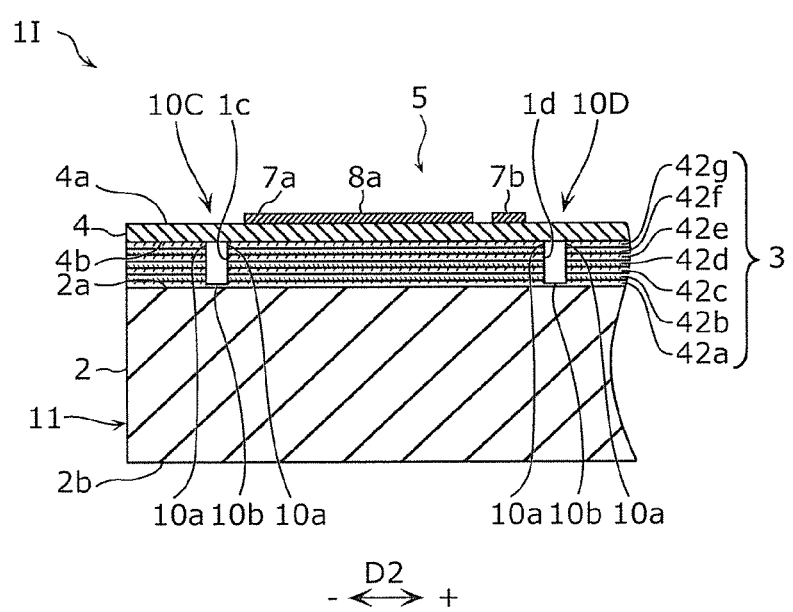
FIG. 12 is a side elevational cross-sectional view of an elastic wave device according to another preferred embodiment of the present invention.

FIG. 12 is a side elevational cross-sectional view of an elastic wave device 1I according to another preferred embodiment of the present invention. This side elevational cross-sectional view is a side view when the elastic wave device 1I is cut along the same or substantially the same position as that of the cross section shown in FIG. 2C.

In the elastic wave device 1I, each of the grooves 10C, 10D is provided in only the intermediate layer 3. Specifically, the grooves 10C, 10D are not provided in the piezoelectric layer 4, but the grooves 10C, 10D are provided in a portion of the intermediate layer 3. In the elastic wave device 1I, the grooves 10C, 10D are provided in the intermediate layer 3 of the piezoelectric substrate 11, elastic waves that propagate in a direction (for example, the perpendicular or substantially perpendicular direction D2) different from the elastic wave propagation direction D1 are reflected by the end surface 1c of the groove 10C and the end surface 1d of the groove 10D, and elastic waves are trapped between the groove 10C and the groove 10D.

With this structure, routing of wires is facilitated, and reflectors are able to be provided on the piezoelectric substrate 11. In addition, the grooves 10C, 10D are able to be disposed inside the IDT electrode 5, so the trapping efficiency is improved. In addition, since the intermediate layer 3 is sealed by the piezoelectric layer 4, for example, when the intermediate layer 3 is made of $SiO_2$, degradation of the intermediate layer 3 is reduced. The grooves 10C, 10D are preferably provided only in at least a portion of the intermediate layer 3.

In the first preferred embodiment, the piezoelectric substrate 11 includes the piezoelectric layer 4, the support substrate 2, and the intermediate layer 3. However, the configuration of the piezoelectric substrate 11 is not limited thereto. The piezoelectric substrate 11 may include a one-piece element, and may preferably be made of, for example, a piezoelectric ceramic material.

In addition, in the first preferred embodiment, the pair of grooves 10A, 10B are provided outside the IDT electrode 5. However, components provided outside the IDT electrode 5 are not limited thereto. A pair of reflectors may be provided in place of the grooves 10A, 10B. In this case as well, since the elastic wave device includes the grooves 10C, 10D opposite to each other in the perpendicular or substantially perpendicular direction D2, leakage of elastic waves in a direction different from the elastic wave propagation direction D1 is reduced or prevented. In addition, the elastic wave device including the grooves 10C, 10D is miniaturized as compared to, for example, when a pair of reflectors is provided outside the IDT electrode 5 in the perpendicular or substantially perpendicular direction D2.

The IDT electrode 5 of each of the elastic wave devices 1 to 1G in the above-described preferred embodiments may be a longitudinally-coupled IDT electrode, a transversely-coupled IDT electrode, or a transversal IDT electrode.

In the above-described preferred embodiments, the input/output wires 9a to 9c on the piezoelectric substrate are connected to the IDT electrodes 5, 5t. However, connection of the input/output wires to the IDT electrodes 5, 5t is not limited thereto. Bonding wires may be connected to the IDT electrodes 5, 5t to define input/output wires.

In addition, the elastic wave device 1 of the present preferred embodiment may be configured such that no grooves (end surfaces) are provided in a piezoelectric thin film and grooves (end surfaces) are provided only in the intermediate layer. The intermediate layer means a layer (including a plurality of layers) from a layer immediately below the piezoelectric thin film to the support substrate. In this case as well, elastic waves present in the intermediate layer are reflected by the grooves (end surfaces) of the intermediate layer, so the efficiency of trapping elastic waves is improved.

The elastic wave devices according to preferred embodiments of the present invention are widely used in various electronic devices and communication devices. Examples of the electronic devices include a sensor. Examples of the communication devices include a communication module device including a PA, an LNA, a switch, and a duplexer including the elastic wave device of the present invention, a mobile communication device including the communication module device, and a healthcare communication device including the communication module device. Examples of the mobile communication devices include a cellular phone, a smartphone, and a car navigation system. Examples of the healthcare communication devices include a weight scale and a body fat scale. The healthcare communication devices and the mobile communication devices each include an antenna, an RF module, an LSI, a display, an input unit, a power supply, and other components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An elastic wave device comprising:
a piezoelectric substrate; and
an IDT electrode provided on the piezoelectric substrate; wherein
the IDT electrode includes a busbar electrode extending in an elastic wave propagation direction and a plurality of electrode fingers connected to the busbar electrode and extending in a direction perpendicular or substantially perpendicular to the elastic wave propagation direction;
the piezoelectric substrate includes at least one groove extending along the elastic wave propagation direction;
the at least one groove is provided on a side across the busbar electrode in the perpendicular or substantially perpendicular direction from a side at which the plurality of electrode fingers are provided;
the piezoelectric substrate includes a support substrate, a piezoelectric layer above the support substrate, and an intermediate layer between the support substrate and the piezoelectric layer;
the IDT electrode is provided on the piezoelectric layer; and
the at least one groove extends from the piezoelectric layer to at least a portion of the intermediate layer, or the at least one groove is provided in at least a portion of the intermediate layer and is not provided in the piezoelectric layer.

2. The elastic wave device according to claim 1, wherein the at least one groove includes a plurality of grooves; and
the plurality of grooves are opposite to each other in the perpendicular or substantially perpendicular direction.

3. The elastic wave device according to claim 1, wherein the intermediate layer includes grain boundaries.

4. The elastic wave device according to claim 1, wherein the intermediate layer adjoins the piezoelectric layer.

5. The elastic wave device according to claim 1, wherein the intermediate layer includes at least one $SiO_2$ layer.

6. The elastic wave device according to claim 1, wherein
an acoustic velocity of bulk waves that propagate through the intermediate layer is lower than an acoustic velocity of elastic waves that propagate through the piezoelectric layer; and
an acoustic velocity of bulk waves that propagate through the support substrate is higher than the acoustic velocity of elastic waves that propagate through the piezoelectric layer.

7. The elastic wave device according to claim 6, wherein the at least one groove extends from the piezoelectric layer to a portion of the support substrate via the intermediate layer.

8. The elastic wave device according to claim 1, wherein
the intermediate layer includes a low acoustic velocity film and a high acoustic velocity film, an acoustic velocity of bulk waves that propagate through the low acoustic velocity film is lower than an acoustic velocity of elastic waves that propagate through the piezoelectric layer, and an acoustic velocity of bulk waves that propagate through the high acoustic velocity film is higher than the acoustic velocity of elastic waves that propagate through the piezoelectric layer;
the low acoustic velocity film is provided between the piezoelectric layer and the support substrate; and
the high acoustic velocity film is provided between the low acoustic velocity film and the support substrate.

9. The elastic wave device according to claim 1, wherein
in the intermediate layer, at least one low acoustic impedance layer and at least one high acoustic impedance layer higher in acoustic impedance than the low acoustic impedance layer are laminated; and
at least one of the at least one low acoustic impedance layer is closer to the piezoelectric layer than the high acoustic impedance layer.

10. The elastic wave device according to claim 1, wherein
an input/output wire that is connected to the IDT electrode is provided on the piezoelectric substrate; and
the at least one groove is provided at a location different from the input/output wire.

11. The elastic wave device according to claim 1, wherein
an input/output wire that is connected to the IDT electrode is provided on the piezoelectric substrate; and
the input/output wire extends around the groove.

12. A front-end circuit comprising:
the elastic wave device according to claim 1.

13. The front-end circuit according to claim 12, wherein the at least one groove includes a plurality of grooves; and
the plurality of grooves are opposite to each other in the perpendicular or substantially perpendicular direction.

14. A communication device comprising:
the front-end circuit according to claim 12; and
a signal processing circuit to process a radio-frequency signal.

15. An elastic wave device comprising:
a piezoelectric substrate; and
an IDT electrode provided on the piezoelectric substrate; wherein
the IDT electrode includes a busbar electrode extending in an elastic wave propagation direction and a plurality of electrode fingers connected to the busbar electrode and extending in a direction perpendicular or substantially perpendicular to the elastic wave propagation direction;
the piezoelectric substrate includes at least one groove extending along the elastic wave propagation direction;
the at least one groove is provided on a side across the busbar electrode in the perpendicular or substantially perpendicular direction from a side at which the plurality of electrode fingers are provided;

the piezoelectric substrate further includes at least one groove extending along the perpendicular or substantially perpendicular direction; and the at least one groove extending along in the perpendicular or substantially perpendicular direction is disposed outside the electrode finger located at an outermost portion of the plurality of electrode fingers in the elastic wave propagation direction.

16. The elastic wave device according to claim 15, wherein the at least one groove extending along the perpendicular or substantially perpendicular direction includes a plurality of grooves; and the plurality of grooves are opposite to each other in the elastic wave propagation direction.

17. The elastic wave device according to claim 16, wherein the IDT electrode is surrounded by a plurality of the grooves extending along the elastic wave propagation direction and a plurality of the grooves extending along the perpendicular or substantially perpendicular direction.

18. The elastic wave device according to claim 15 wherein the piezoelectric substrate includes a support substrate, a piezoelectric layer above the support substrate, and an intermediate layer between the support substrate and the piezoelectric layer;

the IDT electrode is provided on the piezoelectric layer; and at least one of the at least one groove and the at least one groove extending along in the perpendicular or substantially perpendicular direction extends from the piezoelectric layer to at least a portion of the intermediate layer.

* * * * *